US011613068B2

(12) United States Patent
Ryu et al.

(10) Patent No.: US 11,613,068 B2
(45) Date of Patent: Mar. 28, 2023

(54) PREPARATION METHOD OF PATTERNED SUBSTRATE (71) Applicant: LG Chem, Ltd., Seoul (KR)

(72) Inventors: Hyung Ju Ryu, Daejeon (KR); Sung Soo Yoon, Daejeon (KR); Se Jin Ku, Daejeon (KR)

(73) Assignee: LG Chem, Ltd.

( * ) Notice: Subject to any disclaimer, the term of this patent is extended or adjusted under 35 U.S.C. 154(b) by 344 days.

(21) Appl. No.: 16/642,266

(22) PCT Filed: Sep. 13, 2018

(86) PCT No.: PCT/KR2018/010749
§ 371 (c)(1),
(2) Date: Feb. 26, 2020

(87) PCT Pub. No.: WO2019/054768
PCT Pub. Date: Mar. 21, 2019

(65) Prior Publication Data
US 2021/0046691 A1 Feb. 18, 2021

(30) Foreign Application Priority Data
Sep. 13, 2017 (KR) .......... 10-2017-0117010

(51) Int. Cl.
B29C 59/14 (2006.01)
C08F 220/30 (2006.01)
(Continued)

(52) U.S. Cl.
CPC ............ B29C 59/14 (2013.01); B29C 59/005 (2013.01); C08F 212/08 (2013.01);
(Continued)

(58) Field of Classification Search
CPC ..... B29C 59/14; B29C 59/005; C08F 212/08; C08F 220/301; C08F 293/005;
(Continued)

(56) References Cited

U.S. PATENT DOCUMENTS

2002/0173162 A1  11/2002  Liu et al.
2015/0262834 A1*  9/2015  Belostotskiy ..... H01J 37/32091
                                                          438/705
(Continued)

FOREIGN PATENT DOCUMENTS

EP    2733533 A2   5/2014
EP    3203497 A1   8/2017
(Continued)

OTHER PUBLICATIONS

Wipo translation of KR1020160038707 (Year: 2016).*
(Continued)

Primary Examiner — Duy Vu N Deo
(74) Attorney, Agent, or Firm — Lerner, David, Littenberg, Krumholz & Mentlik, LLP (57) ABSTRACT A method for preparing a patterned substrate includes selectively etching any one segment block of a self-assembled block copolymer from a laminate having a substrate; wherein a block copolymer membrane is formed on the substrate and the substrate contains the self-assembled block copolymer. According to the method, the self-assembled pattern of the block copolymer can be efficiently and accurately transferred on the substrate to prepare a patterned substate.

13 Claims, 6 Drawing Sheets (51) Int. Cl.
*B29C 59/00* (2006.01)
*C08F 212/08* (2006.01)
*C08F 293/00* (2006.01)
*H01L 21/311* (2006.01)
*B29K 96/04* (2006.01)

(52) U.S. Cl.
CPC ...... *C08F 220/301* (2020.02); *C08F 293/005* (2013.01); *H01L 21/31138* (2013.01); *B29K 2096/04* (2013.01); *C08F 2438/03* (2013.01)

(58) Field of Classification Search
CPC ........... C08F 2438/03; H01L 21/31138; H01L 21/3081; H01L 21/0274; B29K 2096/04; G03F 7/0002; G03F 7/004; G03F 1/80; C08L 33/12
USPC .......................................... 438/696–714, 723
See application file for complete search history.

(56) References Cited

U.S. PATENT DOCUMENTS

| | | | |
|---|---|---|---|
| 2016/0077263 A1* | 3/2016 | Kwak | G02B 5/3058 359/487.03 |
| 2016/0077439 A1 | 3/2016 | Pimenta Barros et al. | |
| 2016/0099162 A1* | 4/2016 | Ng | H01L 21/32136 269/302 |
| 2016/0280831 A1 | 9/2016 | Park et al. | |
| 2016/0311960 A1 | 10/2016 | Lee et al. | |
| 2017/0011939 A1 | 1/2017 | Tabata et al. | |

FOREIGN PATENT DOCUMENTS

| | | |
|---|---|---|
| JP | 2004119839 A | 4/2004 |
| JP | 2014066976 A | 4/2014 |
| JP | 2016105455 A | 6/2016 |
| JP | 2016539237 A | 12/2016 |
| KR | 100756704 B1 | 9/2007 |
| KR | 20150113438 A | 10/2015 |
| KR | 20160038707 A | 4/2016 |
| KR | 20170006278 A | 1/2017 |
| WO | 2017042312 A1 | 3/2017 |
| WO | 2017068259 A1 | 4/2017 |

OTHER PUBLICATIONS

Wipo translation of 2017042312 (Year: 2017).*
Search report from International Application No. PCT/KR2018/010749, dated Jan. 21, 2019.
Ting, et al., "Plasma etch removal of poly(methyl methacrylate) in block copolymer lithography." Journal of Vacuum Science and Technology. Part B, vol. 26, No. 5, Sep. 5, 2008, pp. 1684-1689.
Borah, D., et al., "Plasma etch technologies for the development of ultra-small feature size transistor devices." Journal of Physics D: Applied Physics, vol. 44, Article No. 174012, Apr. 14, 2011, pp. 1-12.
Extended European Search Report including Written Opinion for Application No. EP18855824.1, dated Sep. 25, 2020, pp. 1-7.

* cited by examiner

PREPARATION METHOD OF PATTERNED SUBSTRATE

CROSS-REFERENCE TO RELATED APPLICATIONS

The present application is a national phase entry under 35 U.S.C. § 371 of International Application No. PCT/KR2018/010749 filed on Sep. 13, 2018, which claims priority from Korean Patent Application No. 10-2017-0117010 filed on Sep. 13, 2017, the disclosures of which are incorporated herein by reference in their entirety.

TECHNICAL FIELD

The present application relates to a method for preparing a patterned substrate.

BACKGROUND ART

A block copolymer has a structure in which polymer blocks having different chemical structures are linked via covalent bonds. The block copolymer can form a periodically arranged structure such as a sphere, a cylinder or a lamella by phase separation. The domain shape and size of the structure formed by a self-assembly phenomenon of the block copolymer can be extensively controlled by, for example, the kind of the monomer forming each block or the relative ratios between the blocks, and the like.

Due to these properties, the block copolymer is being considered for application to nanowire production, production of various next-generation nano devices such as quantum dots or metal dots, or a lithography method capable of forming high-density patterns on a predetermined substrate, and the like.

In order to apply the self-assembled structure of the block copolymer to nano-lithography, a process of selectively removing the polymer of one block through various etching processes is required. However, the etching selectivity varies depending on the kind and the constituent components of the block copolymer to be etched, where the selective etching may be difficult in some cases. In particular, when each block of the block copolymer contains a compound having a similar structure, there is a problem that it is difficult to secure etching selectivity.

PRIOR ART DOCUMENTS

Patent Documents

[8] JP 2014-066976 A

DISCLOSURE OF INVENTION

Technical Problem

The present application provides a method for preparing a patterned substrate, comprising a step of selectively etching any one polymer segment from a polymer membrane which is formed on a substrate and includes a self-assembled structure of a block copolymer having a plurality of different polymer segments.

The present application also provides a method for preparing a patterned substrate, wherein a substrate is etched using a polymer membrane including an etched block copolymer as an etching mask.

Solution to Problem

In this specification, the conjunction "and/or" is used as a meaning including at least one or more of components listed before and after.

In this specification, the term monovalent or divalent hydrocarbon group may mean a monovalent or divalent residue derived from a compound consisting of carbon and hydrogen or a derivative thereof, unless otherwise specified. Here, as the compound consisting of carbon and hydrogen, alkane, alkene, alkyne or aromatic hydrocarbon can be exemplified.

In this specification, the term alkyl group may mean an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group may be a linear, branched or cyclic alkyl group, which may be optionally substituted by one or more substituents.

In this specification, the term alkoxy group may mean an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group may be a linear, branched or cyclic alkoxy group, which may be optionally substituted by one or more substituents.

The term alkenyl group or alkynyl group herein means an alkenyl group or alkynyl group having 2 to 20 carbon atoms, 2 to 16 carbon atoms, 2 to 12 carbon atoms, 2 to 8 carbon atoms or 2 to 4 carbon atoms, unless otherwise specified. The alkenyl or alkynyl group may be linear, branched or cyclic, which may be optionally substituted by one or more substituents.

The term alkylene group herein may mean an alkylene group having 1 to 20 carbon atoms, 1 to 16 carbon atoms, 1 to 12 carbon atoms, 1 to 8 carbon atoms or 1 to 4 carbon atoms, unless otherwise specified. The alkylene group may be a linear, branched or cyclic alkylene group, which may be optionally substituted by one or more substituents.

The term alkenylene group or alkynylene group herein may mean an alkenylene group or alkynylene group having 2 to 20 carbon atoms, 2 to 16 carbon atoms, 2 to 12 carbon atoms, 2 to 8 carbon atoms or 2 to 4 carbon atoms. The alkenylene group or alkynylene group may be linear, branched or cyclic, which may be optionally substituted by one or more substituents.

In this specification, the term chain structure is a hydrocarbon structure other than a ring structure, which means a structure in which carbon atoms of the hydrocarbon are connected in a chain shape. Also, the linear structure means a straight chain structure. In addition, the branched structure means a chain structure in which a branch is formed in a linear structure.

In this specification, the term ring structure means a structure in which both ends chained at the hydrocarbon skeleton are connected to form a ring shape.

The term aryl group or arylene group herein may mean, unless otherwise specified, a monovalent residue or divalent residue derived from a compound comprising one benzene structure, or a structure in which two or more benzene rings are linked while sharing one or two carbon atoms, or linked by any linker, or a derivative thereof. The aryl group or arylene group may be, for example, an aryl group or arylene group having 6 to 30 carbon atoms, 6 to 25 carbon atoms, 6 to 21 carbon atoms, 6 to 18 carbon atoms or 6 to 13 carbon atoms, unless otherwise specified.

In this specification, the term aromatic structure may mean the aryl group or arylene group.

In this specification, the term alicyclic ring structure means a cyclic hydrocarbon structure other than an aromatic ring structure, unless otherwise specified. The alicyclic ring structure may be, for example, an alicyclic ring structure having 3 to 30 carbon atoms, 3 to 25 carbon atoms, 3 to 21 carbon atoms, 3 to 18 carbon atoms or 3 to 13 carbon atoms, unless otherwise specified.

In the present application, the term single bond may mean a case where no separate atom is present at the relevant site. For example, in the structure represented by A-B-C, when B is a single bond, no separate atom exists at the site represented by B, and A and C are directly connected, so that it may mean to form a structure represented by A-C.

In the present application, the substituent, with which the alkyl group, alkenyl group, alkynyl group, alkylene group, alkenylene group, alkynylene group, alkoxy group, aryl group, arylene group, chain or aromatic structure, and the like may be optionally substituted, may be exemplified by a hydroxy group, a halogen atom, a carboxyl group, a glycidyl group, an acryloyl group, a methacryloyl group, an acryloyloxy group, a methacryloyloxy group, a thiol group, an alkyl group, an alkenyl group, an alkynyl group, an alkylene group, an alkenylene group, an alkynylene group, an alkoxy group or an aryl group, and the like, but is not limited thereto.

The present application relates to a method for preparing a patterned substrate. The preparation method of the present application comprises a step of selectively etching, from a laminate having a substrate; and a block copolymer membrane formed on the substrate and containing a self-assembled block copolymer, any one segment block of the block copolymer, wherein the etching is performed using a reaction gas containing fluorocarbon and oxygen and the etching is performed while maintaining a ratio (A/B) of a flow rate (A) of the fluorocarbon to a flow rate (B) of the oxygen in a range of 0.5 to 7.5.

In the preparation method of the present application, as any one polymer segment block of a block copolymer is selectively removed, the polymer segment block remaining on the substrate can form a microstructure. In addition, when a polymer membrane, in which any one polymer segment block of a block copolymer is selectively removed, is used as an etching mask, a patterned substrate can be produced.

The type of the substrate is not particularly limited. As the substrate, for example, various types of substrates requiring formation of a pattern on the surface may be used for application to the above-described applications. As this type of substrate, for example, a semiconductor substrate such as a silicon substrate, a silicon germanium substrate, a GaAs substrate and a silicon oxide substrate is included. As the substrate, for example, a substrate applied to formation of finFETs (fin field effect transistors) or other electronic devices such as diodes, transistors or capacitors may be used. In addition, other materials such as ceramics may be used as the substrate depending on the application, and the types of substrates that can be applied in the present application are not limited thereto.

As will be described below, the block copolymer may comprise a polymer segment A block and a polymer segment B block having a structure different from that of the polymer segment A, where each of the polymer segment A block and the polymer segment B may comprise a ring structure. The fact that each of the polymer segment A block and the polymer segment B block comprises a ring structure may mean that the polymer segment A block comprises a ring structure and at the same time, the polymer segment B block comprises a ring structure. The ring structure may mean an aromatic compound or an alicyclic compound. In the method for preparing a patterned substrate according to the present application, both the polymer segment A block and the polymer segment B block comprise compounds having ring structures to have a similar chemical property, but the selective etching of the polymer segment A block and the polymer segment B block is possible. In addition, the method according to the present application can produce a patterned substrate by selectively etching the polymer segment A block or the polymer segment B block.

The etching is performed while maintaining a ratio (A/B) of a flow rate (A) of the fluorocarbon to a flow rate (B) of the oxygen in a range of 0.5 to 7.5. Specifically, in the etching, the ratio (A/B) of the flow rate (A) of the fluorocarbon to the flow rate (B) of the oxygen may be 0.50 or more, 0.51 or more, 0.52 or more, 0.53 or more, 0.54 or more, 0.55 or more, 0.56 or more, 0.57 or more, 0.58 or more, 0.59 or more, or 0.60 or more, and may be 7.5 or less, 7.4 or less, 7.3 or less, 7.2 or less, 7.1 or less, 7.0 or less, 6.9 or less, 6.8 or less, 6.7 or less, 6.6 or less, 6.5 or less, 6.4 or less, 6.3 or less, 6.2 or less, 6.1 or less, 6.0 or less, 5.9 or less, 5.8 or less, 5.7 or less, 5.6 or less, 5.5 or less, 5.4 or less, 5.3 or less, 5.2 or less, 5.1 or less, 5.0 or less, 4.9 or less, 4.8 or less, 4.7 or less, 4.6 or less, 4.5 or less, 4.4 or less, 4.3 or less, 4.2 or less, 4.1 or less, or 4.0 or less. When the etching is performed by satisfying the ratio range of the flow rates, the selective etching of any one segment block in the block copolymer can be performed smoothly. However, if the ratio is less than or more than the above range, the selective etching of any one segment block in the block copolymer is not performed or even if it is performed, the degree is insignificant, whereby there is a problem that it is not easy to distinguish between the segment blocks.

In a conventional method using a reaction gas (for example, Ar/O2) composed of an inert gas and an oxygen gas, the selective etching of a block copolymer containing a polymer segment A block and a polymer segment B block simultaneously containing compounds having a similar structure was not possible, or was rarely achieved. However, when a reaction gas containing fluorocarbon and oxygen is used and the ratio (A/B) of the flow rate (A) of the fluorocarbon to the flow rate (B) of the oxygen is adjusted to the above range as in the method of the present application, the selective etching, which is impossible in the conventional method, becomes possible.

The etching may maintain a flow rate of fluorocarbon of more than 0 sccm and 50 sccm or less. Specifically, the flow rate of fluorocarbon in the etching step may be 50 sccm or less, 49 sccm or less, 48 sccm or less, 47 sccm or less, 46 sccm or less, 45 sccm or less, 44 sccm or less, 43 sccm or less, 42 sccm or less, 41 sccm or less, or 40 sccm or less, and may be more than 0 sccm, 1 sccm or more, 2 sccm or more, 3 sccm or more, 4 sccm or more, 5 sccm or more, 6 sccm or more, 7 sccm or more, 8 sccm or more, 9 sccm or more, 10 sccm or more, 11 sccm or more, 12 sccm or more, 13 sccm or more, 14 sccm or more, or 15 sccm or more.

The etching may maintain a flow rate of oxygen of more than 0 sccm and 35 sccm or less. Specifically, the etching may maintain a flow rate of oxygen of 34 sccm or less, 33 or less sccm, 32 sccm or less, 31 sccm or less, 30 sccm or less, 29 sccm or less, 28 sccm or less, 27 sccm or less, 26 sccm or less, or 25 sccm or less, and the flow rate may be 1 sccm or more, 2 sccm or more, 3 sccm or more, 4 sccm or more, 5 sccm or more, 6 sccm or more, 7 sccm or more, 8 sccm or more, 9 sccm or more, or 10 sccm or more.

The reaction gas may further comprise an inert gas such as neon, argon or xenon in addition to fluorocarbon and oxygen. In this case, the etching may further supply an inert gas at a flow rate of 200 sccm or less. Specifically, the flow rate of the inert gas may be 180 sccm or less, 160 sccm or less, 140 sccm or less, 120 sccm or less, 110 sccm or less, or 100 sccm or less, and may be more than 0 sccm, 20 sccm or more, 40 sccm or more, 60 sccm or more, 80 sccm or more, 90 sccm or more, or 100 sccm or more.

When the reaction gas further comprises an inert gas, the etching may maintain a ratio (A/C) of a flow rate (A) of fluorocarbon to a flow rate (C) of an inert gas in a range of 0.1 to 1. Specifically, the ratio (A/C) of the flow rate (A) of the fluorocarbon to the flow rate (C) of the inert gas may be 0.10 or more, 0.11 or more, 0.12 or more, 0.13 or more, 0.14 or more, or 0.15 or more, and may be 1.0 or less, 0.9 or less, 0.8 or less, 0.7 or less, 0.6 or less, 0.5 or less, 0.4 or less, 0.3 or less, 0.2 or less, 0.19 or less, 0.18 or less, 0.17 or less, 0.16 or less, or 0.15 or less.

When the etching is performed so that the ratio (A/C) of the flow rate (A) of the fluorocarbon to the flow rate (C) of the inert gas satisfies the above range, even if the inert gas is used, the above-described selective etching of any one segment in a block copolymer may be possible.

Specifically, as the reaction gas, only fluorocarbon and oxygen may be supplied, or only fluorocarbon, oxygen and an inert gas may also be supplied.

By controlling flow rates and/or flow rate ratios of fluorocarbon, oxygen and an inert gas contained in a reaction gas in the above range, the method of the present application may selectively etch any one polymer segment of the block copolymer having the above-mentioned properties and may allow the non-etched polymer segment to form a microstructure on a substrate.

As the fluorocarbon, fluorocarbon having two or more fluorine atoms and having a ratio (F/C) of fluorine atoms (F) to carbon atoms (C) of 2 or more can be used. Specifically, the ratio of fluorine atoms to carbon atoms in the fluorocarbon may be 2.2 or more, 2.4 or more, 2.6 or more, 2.8 or more, or 3.0 or more, and may be 4.0 or less, 3.8 or less, 3.6 or less, 3.4 or less, 3.2 or less, or 3.0 or less.

In the present application, the term fluorocarbon may mean a compound containing at least one fluorine atom attached to a carbon atom. The fluorocarbon may be fluorocarbon having 1 to 20, 1 to 16, 1 to 12, 1 to 8 or 1 to 6 carbon atoms and may be fluorocarbon having 1 to 20, 1 to 16, 1 to 12, 1 to 10 or 2 to 10 fluorine atoms.

In one example, the fluorocarbon having two or more fluorine atoms and having an F/C ratio of 2 or more is not particularly limited as long as it satisfies the above F/C ratio. For example, a halogenated alkane can be applied, and as such a halogenated alkane, a halogenated alkane having 1 to 20 carbon atoms, 1 to 16 carbon atoms, 1 to 12 carbon atoms, 1 to 8 carbon atoms or 1 to 4 carbon atoms can be applied. An example of such a material may be one or more selected from the group consisting of $CHF_3$, $CH_2F_2$, $C_2F_6$, $C_3F_8$, $C_4F_6$, $C_4F_8$, $C_4F_{10}$, $C_5F_{10}$, $CCl_2F_2$, $CF_3I$, $CF_3Br$, $CHF_2COF$ and $CF_3COF$, but is not limited thereto.

Conventionally, etching was attempted using a reaction gas containing an inert gas and oxygen, but selective etching of a block copolymer having a similar chemical composition was impossible. However, the method of the present application may use a fluorocarbon gas satisfying the F/C ratio as a reaction gas to improve etching selectivity for a block copolymer which is described below.

In one example, the etching may be performed by a method such as inductively coupled plasma (ICP) etching or reactive ion etching (RIE), and specifically, may be performed by reactive ion etching. When the etching is performed by reactive ion etching, the process is described with reference to FIG. 12 as follows.

Figure 12:
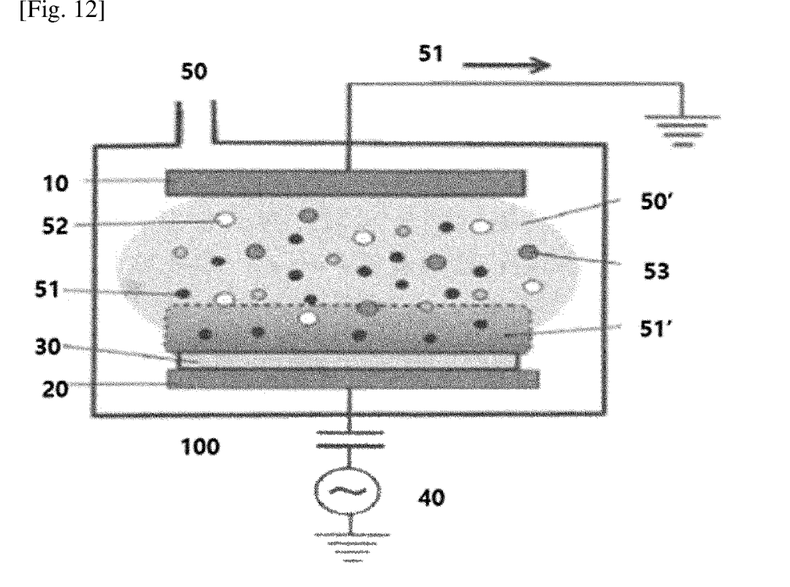
FIG. 12 is a schematic diagram of a reactive ion etching apparatus.

The etching is performed in a chamber in which two opposite cathode and anode are present, and the substrate on which the block copolymer membrane is formed is positioned on the cathode between the cathode and the anode, where an RF power source may be applied to the cathode. When the reaction gas is supplied into the reaction chamber and the RF power source is applied to the cathode, the reaction gas can be in a plasma state. In this case, the reaction gas can be ionized to form electrons, ions of the reaction gas and radicals of the reaction gas, whereby the non-ionized reaction gas, and the electrons, the ions of the reaction gas and the radicals of the reaction gas can coexist in the reaction chamber.

In the case of electrons, they can enter the anode and the cathode by the applied RF power source. The electrons entering the anode can be released as they are. On the other hand, the electrons entering the cathode cannot flow due to the influence of the reaction chamber, and as a result, the cathode may exhibit a high voltage by accumulation of electrons to form a layer (ion sheath or ion shell) in which space charges are accumulated.

The ions of the reaction gas are not affected by the RF power source, but are attracted by the high voltage of the ion sheath formed on the cathode and collide with the substrate including the block copolymer membrane formed on the cathode. In addition, since the radicals of the reaction gas are neutral, there is no influence of the voltage, but since they have strong chemical activity, they can react with the block copolymer membrane. Accordingly, the polymer segment A block and the polymer segment B block included in the block copolymer can be selectively etched.

The inside of the chamber that the cathode and anode exist can maintain a vacuum state, and for example, the pressure inside the chamber may be maintained at 30 mTorr or less, 28 mTorr or less, 26 mTorr or less, 24 mTorr or less, 22 mTorr or less, 20 mTorr or less, 18 mTorr or less, 16 mTorr or less, or 15 mTorr or less, and may be maintained at more than 0 mTorr, 2 mTorr or more, 4 mTorr or more, 6 mTorr or more, 8 mTorr or more, 10 mTorr or more, 12 mTorr or more, 14 mTorr or more, or 15 mTorr or more. The method of maintaining the inside of the reaction chamber under a vacuum is not particularly limited, but it is possible to use a known depressurization method such as passing a gas such as $SF_6$ into the reaction chamber.

On the other hand, as an apparatus for the reactive ion etching, a known reactor can be used, and for example, a Plasmalab system from Oxford Instruments or 100RIE-101iPH from Samco Inc., and the like can be used.

In another example of the present application, the applied electric power of a high-frequency induction coil (RF coil) used in the etching step of the present application can be maintained in a range of 150 W to 400 W. The applied electric power may mean an electric power applied to the cathode by a high-frequency induction coil (RF coil) of a reactive ion etching reactor, which may be 400 W or less, 390 W or less, 380 W or less, 370 W or less, 360 W or less, 350 W or less, 340 W or less, 330 W or less, 320 W or less, 310 W or less, or 300 W or less, but is not limited thereto. The lower limit of the applied electric power may be 150 W or more, 160 W or more, 170 W or more, 180 W or more, 190 W or 200 W or more, but is not limited thereto. By keeping the applied electric power of the etching step of the present application in the above range, while effectively etching the polymer segment block of the block copolymer to be etched, the polymer segment block of the block copolymer that is not removed after etching can be effectively remained.

The block copolymer to be applied to the method of the present application may comprise a polymer segment A block and a polymer segment B block having a structure different from that of the polymer segment A.

The polymer segment A block and the polymer segment B block may each comprise a ring structure. The ring structure means a structure in which both ends chained at the hydrocarbon skeleton are connected to form a ring shape.

In one example, the ring structure may be an aromatic structure. The aromatic structure may mean an aryl group or arylene group having 6 to 30 carbon atoms, 6 to 25 carbon atoms, 6 to 21 carbon atoms, 6 to 18 carbon atoms or 6 to 13 carbon atoms.

In another example, the ring structure may be an alicyclic structure. The alicyclic structure may be an alicyclic ring structure having 3 to 30 carbon atoms, 3 to 25 carbon atoms, 3 to 21 carbon atoms, 3 to 18 carbon atoms or 3 to 13 carbon atoms. The alicyclic ring structure means a cyclic hydrocarbon structure other than an aromatic ring structure, unless otherwise specified.

In one example of the present application, the polymer segment A of the block copolymer may comprise a chain having eight or more chain-forming atoms. The chain-forming atom of the present application means an atom which forms a straight chain structure (linear) among hydrocarbons having a chain-like structure. The number of chain-forming atoms is calculated by only the number of atoms forming the longest straight-chain, and the other atoms (for example, if the chain-forming atom is a carbon atom, hydrogen atoms bonded to the carbon atom, etc.) bonded to the chain-forming atoms are not calculated. In addition, when the chain is a branched chain structure, the number of chain-forming atoms can be calculated as the number of chain-forming atoms forming the longest chain. For example, when the chain is an n-pentyl group, all of the chain-forming atoms are carbon, where the number is 5, and even if the chain is a 2-methylpentyl group, all of the chain-forming atoms are carbon, where the number is 5. The chain-forming atom may be exemplified by carbon, oxygen, sulfur or nitrogen, and the like, and an appropriate chain-forming atom may be carbon, oxygen or nitrogen, or may be carbon or oxygen. The number of chain-forming atoms may be 8 or more, 9 or more, 10 or more, 11 or more, or 12 or more. The number of chain-forming atoms may also be 30 or less, 25 or less, 20 or less, 16 or less, 14 or less, or 12 or less. As the polymer segment A block contains a chain having eight or more chain-forming atoms, it can have etching resistance to a reaction gas containing fluorocarbon. Specifically, when the reaction gas containing fluorocarbon is used as described above, the polymer segment B block may be etched.

In another example of the present application, the polymer segment A block may comprise a ring structure on which a chain having eight or more chain-forming atoms is substituted. As the polymer segment A block comprises a ring structure, it can exhibit excellent self-assembling properties. The ring structure may be an aromatic structure or an alicyclic ring structure.

The ring structure of the polymer segment A block may not comprise a halogen atom. Also, the ring structure of the polymer segment B block may comprise a halogen atom. The fact that the ring structure of the polymer segment A block does not comprise a halogen atom means a case where the ring structure is composed of atoms other than a halogen atom, a case of substantially comprising no halogen atom, or a case where even if the ring structure contains a halogen atom, the content is insignificant so as not to affect physical properties of the polymer segment A block.

In one example, the polymer segment A block of the block copolymer according to the present application may comprise a unit represented by Formula 1 below.

[Formula 1]

In Formula 1, R is hydrogen or an alkyl group, X is a single bond, an oxygen atom, a sulfur atom, —S(=O)$_2$—, a carbonyl group, an alkylene group, an alkenylene group, an alkynylene group, —C(=O)—X$_1$— or —X$_1$—C(=O)$_2$—, where X$_1$ is an oxygen atom, a sulfur atom, —S(=O)$_2$—, an alkylene group, an alkenylene group or an alkynylene group, and Y is a monovalent substituent containing a ring structure connected by a chain having eight or more chain-forming atoms.

In another example, X in Formula 1 may be a single bond, an oxygen atom, a carbonyl group, —C(=O)—O— or —O—C(=O)—, or may be —C(=O)—O—, but is not limited thereto.

The monovalent substituent of Y in Formula 1 comprises a chain structure formed by at least eight chain-forming atoms.

The unit of Formula 1 can make the block copolymer exhibit excellent self-assembling properties.

In one example, the chain may be a linear hydrocarbon chain such as a linear alkyl group. In this case, the alkyl group may be an alkyl group having 8 or more carbon atoms, 8 to 30 carbon atoms, 8 to 25 carbon atoms, 8 to 20 carbon atoms or 8 to 16 carbon atoms. One or more of carbon atoms in the alkyl group may optionally be substituted with an oxygen atom, and at least one hydrogen atom in the alkyl group may be optionally substituted by another substituent.

In Formula 1, Y may comprise a ring structure, where the chain may be connected to the ring structure. By such a ring structure, the self-assembling property and the like of the block copolymer formed by the monomers can be further improved. The ring structure may be an aromatic structure or an alicyclic structure.

The chain may be directly connected to the ring structure, or may be connected via a linker. The linker may be exemplified by an oxygen atom, a sulfur atom, —NR$_1$—, S(=O)$_2$—, a carbonyl group, an alkylene group, an alkenylene group, an alkynylene group, —C(=O)—X$_1$— or —X$_1$—C(=O)—, and the like, where R$_1$ may be hydrogen, an alkyl group, an alkenyl group, an alkynyl group, an alkoxy group or an aryl group, X$_1$ may be a single bond, an oxygen atom, a sulfur atom, —NR$_2$—, —S(=O)$_2$—, an alkylene group, an alkenylene group or an alkynylene group, and R$_2$ may be hydrogen, an alkyl group, an alkenyl group, an alkynyl group, an alkoxy group or an aryl group. An appropriate linker may be exemplified by an oxygen atom or a nitrogen atom. The chain may be connected to an aromatic structure via, for example, an oxygen atom or a nitrogen atom. In this case, the linker may be an oxygen atom, or may be —NR₁— (where R₁ is hydrogen, an alkyl group, an alkenyl group, an alkynyl group, an alkoxy group or an aryl group).

In one example, Y of Formula 1 may be represented by Formula 2 below.

P-Q-Z  [Formula 2]

In Formula 2, P is an arylene group, Q is a single bond, an oxygen atom or —NR₃—, where R₃ is hydrogen, an alkyl group, an alkenyl group, an alkynyl group, an alkoxy group or an aryl group, and Z is the chain having eight or more chain-forming atoms. When Y of Formula 1 is a substituent of Formula 2 above, P of Formula 2 above may be directly connected to X of Formula 1.

A suitable example of P in Formula 2 may be exemplified by an arylene group having 6 to 12 carbon atoms, such as a phenylene group, but is not limited thereto.

A suitable example of Q in Formula 2 may include an oxygen atom or —NR₁— (where R₁ is hydrogen, an alkyl group, an alkenyl group, an alkynyl group, an alkoxy group or an aryl group), and the like.

A suitable example of the unit of Formula 1 may include a unit in which in Formula 1 above, R is hydrogen or an alkyl group, such as hydrogen or an alkyl group having 1 to 4 carbon atoms, X is —C(=O)—O—, and Y is Formula 2 above, where P is an arylene group having 6 to 12 carbon atoms or a phenylene group, Q is an oxygen atom and Z is the above-described chain having 8 or more chain-forming atoms.

Accordingly, the unit as a suitable example of Formula 1 may include a unit of Formula 3 below.

[Formula 3]

In Formula 3, R is hydrogen or an alkyl group having 1 to 4 carbon atoms, X is —C(=O)—O—, P is an arylene group having 6 to 12 carbon atoms, Q is an oxygen atom, Z is the chain having 8 or more chain-forming atoms.

As the block copolymer of the present application comprises a polymer segment A block containing units represented by Formulas 1, 2 and/or 3, it is possible to exhibit excellent self-assembling properties of the block copolymer, and the self-assembled structure can form a vertically oriented lamellar structure or a vertically oriented sphere structure.

In another example of the present application, the polymer segment B block of the block copolymer may comprise an aromatic structure comprising one or more halogen atoms. As the block copolymer contains an aromatic structure containing one or more halogen atoms as the polymer segment B, it is possible to exhibit excellent phase separation characteristics and etching selectivity.

In one example, the polymer segment B block of the block copolymer of the present application may comprise a unit represented by Formula 4 below.

[Formula 4]

In Formula 4, X₂ is a single bond, an oxygen atom, a sulfur atom, —S(=O)₂—, an alkylene group, an alkenylene group, an alkynylene group, —C(=O)—X₁— or —X₁—C(=O)₂—, where X₁ is a single bond, an oxygen atom, a sulfur atom, —S(=O)₂—, an alkylene group, an alkenylene group or an alkynylene group, and W is an aryl group containing at least one halogen atom. Here, W may be an aryl group substituted with at least one halogen atom, for example, an aryl group having 6 to 12 carbon atoms substituted with 2 or more 3 or more, 4 or more, or 5 or more halogen atoms.

The unit of Formula 4 above may be, for example, a unit represented by Formula 5 below.

[Formula 5]

In Formula 5, X₂ is a single bond, an oxygen atom, a sulfur atom, —S(=O)₂—, an alkylene group, an alkenylene group, an alkynylene group, —C(=O)—X₁— or —X₁—C(=O)₂—, where X₁ is a single bond, an oxygen atom, a sulfur atom, —S(=O)₂—, an alkylene group, an alkenylene group or an alkynylene group, and R₁ to R₅ are each independently hydrogen, an alkyl group, a haloalkyl group or a halogen atom, where the number of halogen atoms contained in R₁ to R₅ is one or more.

In another example, X₂ in Formula 5 may be a single bond, an oxygen atom, an alkylene group, —C(=O)—O— or —O—C(=O)—.

In Formula 5, R₁ to R₅ are each independently hydrogen, an alkyl group, a haloalkyl group or a halogen atom, provided that R₁ to R₅ may comprise 1 or more, 2 or more, 3 or more, 4 or more, or 5 or more halogen atoms, for example, fluorine atoms. The halogen atoms, for example, fluorine atoms contained in R₁ to R₅ may be 10 or less, 9 or less, 8 or less, 7 or less, or 6 or less.

As the block copolymer according to the present application comprises the unit of Formula 4 or 5 above, the block copolymer can exhibit excellent self-assembling properties.

The absolute value of the difference between the surface energy of the polymer segment A block and the surface energy of the polymer segment B block in the block copolymer of the present application may be 10 mN/m or less, 9 mN/m or less, 8 mN/m or less, 7.5 mN/m or less, or 7 mN/m or less. The absolute value of the difference in surface energy may be 1.5 mN/m, 2 mN/m or 2.5 mN/m or more. The structure in which the polymer segment A block and B block having the absolute value of the difference in surface energy in this range are connected by covalent bonds can induce effective microphase separation. Here, the polymer segment A block may mean, for example, the above-described polymer segment A block.

The surface energy can be measured using a drop shape analyzer (DSA100 product from KRUSS). Specifically, the surface energy can be measured for a membrane in which a coating liquid obtained by diluting a target sample (block copolymer or homopolymer), which is measured, in fluorobenzene to a solid concentration of about 2 wt %, is coated on a substrate to a thickness of about 50 nm and a coating area of 4 cm$^2$ (width: 2 cm, height: 2 cm), and dried at room temperature for about 1 hour, and then subjected to thermal annealing at 160° C. for about 1 hour. The process of dropping the deionized water whose surface tension is known on the membrane subjected to the thermal annealing and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane. The numerical value of the surface energy for each polymer segment of the block copolymer can be obtained for a homopolymer made of only the monomer forming the polymer segment by the above-described method.

The block copolymer of the present application may embody a cyclic structure, including a sphere, a cylinder, a gyroid or a lamellar, and the like through self-assembly. In the case of the sphere or the lamella of the above structures, the block copolymer may be in a vertically oriented state.

In the present application, a specific method for producing such a block copolymer is not particularly limited as long as it includes units represented by the above-described formulas.

For example, the block copolymer can be prepared by the LRP (Living Radical Polymerization) method using the above monomers. For example, there are anion polymerization in which polymerization is carried out in the presence of an inorganic acid salt such as an alkali metal or alkaline earth metal salt or an organoaluminum compound using an organic rare earth metal complex or an organic alkali metal compound as an initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method, a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected and applied among the above methods.

For example, the block copolymer can be prepared in a manner which comprises polymerizing a reactant containing monomers capable of forming the block in the presence of a radical initiator and a living radical polymerization reagent by the living radical polymerization method.

The method for forming other blocks included in the copolymer, together with the block formed by using the monomer, upon producing the block copolymer is not particularly limited, and the other blocks may be formed by selecting a suitable monomer in consideration of the kind of the desired block.

The process for preparing the block copolymer may further comprise, for example, a step of precipitating the polymerization product produced through the above process in the non-solvent.

The kind of the radical initiator is not particularly limited, may be appropriately selected in consideration of the polymerization efficiency, and for example, an azo compound such as AIBN (azobisisobutyronitrile), ABCN (1,1'-azobis(cyclohexanecarbonitrile)) or 2,2'-azobis-(2,4-dimethylvaleronitrile), or peroxide series such as BOP (benzoyl peroxide) or DTBP (di-t-butyl peroxide) may be used.

The living radical polymerization process can be carried out in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethylsulfoxide or dimethylacetamide.

As the non-solvent, an alcohol such as methanol, ethanol, normal propanol or isopropanol, a glycol such as ethylene glycol, ether series such as n-hexane, cyclohexane, n-heptane or petroleum ether, and the like can be used, but is not limited thereto.

In the method for preparing a patterned substrate of the present application, the laminate may further comprise an intermediate layer between the substrate and the block copolymer membrane.

The surface of the intermediate layer according to the present application may exhibit weak selectivity.

In the present application, the fact that the surface exhibits "neutral" may mean a surface that the first and second polymer components included in the block copolymer have substantially the same/similar level of surface tension (or affinity) to the relevant surface. In addition, the surface whose surface represents "selectivity" (preferential surface) may mean that the surface energy for the first polymer component (or the second polymer component) is lower than the surface energy for the second polymer component (or the first polymer component) and thus, he first polymer component (or the second polymer component) preferentially contacts the relevant surface (the first polymer component (or the second polymer component) has a preferential wettability). Moreover, the surface exhibiting "weak selectivity" may mean a surface exhibiting intermediate selectivity between a neutral surface and a surface having selectivity. The surface exhibiting weak selectivity can induce a state where in a self-assembled structure of the above-described block copolymer, vertical orientation and horizontal orientation are mixed, which can be formed using a random copolymer to be described below. The surface having weak selectivity may have, in a state where the vertical orientation and the horizontal orientation are mixed, a ratio that the vertical orientation occupies of 40 wt % or more, 45 wt % or more, 50 wt % or more, 55 wt % or more, or 60 wt % or more, and may have a ratio of 90 wt % or less, 85 wt % or less, 80 wt % or less, 75 wt % or less, or 70 wt % or less. Also, the surface having weak selectivity may have, in a state where the vertical orientation and the horizontal orientation are mixed, a ratio that the horizontal orientation occupies of 10 wt % or more, 15 wt % or more, 20 wt % or more, 25 wt % or more, or 30 wt % or more, and may have a ratio of 60 wt % or less, 55 wt % or less, 50 wt % or less, 45 wt % or less, or 40 wt % or less.

Also, the polymer forming the intermediate layer may be a random copolymer of monomers having units capable of forming the above-mentioned block copolymer. In one example, the random copolymer may be a random copolymer of a monomer (first monomer) capable of forming the above-mentioned polymer segment A by containing the above-mentioned unit of Formula 1 or 3 as a main component and a monomer (second monomer) capable of forming the above-mentioned polymer segment B by containing the above-mentioned unit of Formula 4 or 4 as a main component.

The weight ratio (X/Y) of the first monomer (X) to the second monomer (Y) is not particularly limited as long as it satisfies the weak selectivity of the above-mentioned intermediate layer, but may be less than 0.5, and the lower limit is not particularly limited, but may be, for example, 0 or more. In another example, the weight ratio (X/Y) of the first monomer (X) to the second monomer (Y) may be more than 0.5, and the upper limit is not particularly limited, but may be, for example, 1 or less. By making the weight ratio of the first monomer to the second monomer in the random copolymer forming the intermediate layer satisfy the above range, the intermediate layer may not exhibit neutrality. In addition, by making the weight ratio of the first monomer to the second monomer in the random copolymer forming the intermediate layer satisfy the above range, it is possible to make the intermediate layer have the above-described weak selectivity, whereby the membrane comprising the block copolymer formed on the intermediate layer can form a vertically oriented lamellar structure.

In the present application, the intermediate layer may be formed to a thickness of 5 nm or less, which may be, for example, 4.8 nm or less, 4.6 nm or less, 4.4 nm or less, 4.2 nm or less, 4.0 nm or less, 3.8 nm or less, or 3.6 nm or less, and may be 0.1 nm or more, 0.2 nm or more, 0.3 nm or more, 0.4 nm or more, or 0.5 nm or more.

The method for preparing a patterned substrate of the present application may further comprise a step of etching the substrate using the polymer membrane, from which any one polymer segment block has been removed by the above-described etching method, as a mask. In this way, it is possible to form, for example, a nano-scale fine pattern. In addition, various types of patterns such as nano-rods or nano-holes can be formed on the substrate through the above method according to the shape of the block copolymer in the polymer membrane.

The step of etching the substrate using the polymer membrane, from which the polymer segment has been selectively removed, as a mask is not particularly limited, which may be performed through a reactive ion etching step using, for example, $SF_6$ ions, and the like, and following this process, a step of removing the polymer membrane from the substrate by an oxygen plasma treatment or the like can also be performed.

Advantageous Effects of Invention

According to the method of the present application, in a process of transferring a self-assembled pattern of a block copolymer on a substrate to form a pattern, the self-assembled pattern of the block copolymer can be efficiently and accurately transferred on the substrate to prepare a patterned substrate.

MODE FOR THE INVENTION

Hereinafter, the present application will be described more in detail by way of examples according to the present application and comparative examples, but the scope of the present application is not limited by the following examples.

1. GPC (gel permeation chromatography)

The number average molecular weight (Mn) and the molecular weight distribution were measured using GPC (Gel Permeation Chromatography). Analytes are introduced into a 5 mL vial and diluted in THF (tetrahydrofuran) so as to be a concentration of about 1 mg/mL. Then, the calibration standard sample and the sample to be analyzed were filtered through a PTFE syringe filter (pore size: 0.45 μm) and then measured. As an analytical program, ChemStation from Agilent Technologies was used, and the elution time of the sample was compared with the calibration curve to obtain the weight average molecular weight (Mw) and the number average molecular weight (Mn), respectively, and to calculate the molecular weight distribution (PDI) from the ratio (Mw/Mn). The measurement conditions of GPC are as follows.

<GPC measurement conditions>
Device: 1200 series from Agilent Technologies
Column: using two PLgel mixed B from Polymer laboratories
Solvent: THF
Column temperature: 35° C.
Sample concentration: 1 mg/mL, 20 μL injection
Standard samples: polystyrene (Mp: 3900000, 723000, 316500, 52200, 31400, 7200, 3940, 485)

2. NMR analysis

The NMR analysis was performed at room temperature using an NMR spectrometer including a Varian Unity Inova (500 MHz) spectrometer with a triple resonance 5 mm probe. An analyte was diluted in a solvent (CDC13) for measuring NMR 23 to a concentration of about 10 mg/ml and used, and chemical shifts were expressed in ppm.

<Application Abbreviations>
br=wide signal, s=singlet, d=doublet, dd=double doublet, t=triplet, dt=double triplet, q=quartet, p=quintet, m=muliplet.

PREPARATION EXAMPLE 1

Synthesis of Monomer (A)

The compound (DPM-C12) of Formula A below was synthesized in the following manner. Hydroquinone (10.0 g, 94.2 mmol) and 1-bromododecane (23.5 g, 94.2 mmol) were placed in a 250 mL flask, dissolved in 100 mL of acetonitrile, and then an excess amount of potassium carbonate was added thereto and reacted at 75° C. for about 48 hours under a nitrogen condition. After the reaction, the remaining potassium carbonate was filtered off and the acetonitrile used in the reaction was also removed. A mixed solvent of DCM (dichloromethane) and water was added thereto to work up the mixture, and the separated organic layers were collected and passed through $MgSO_4$ to be dehydrated. Subsequently, the target product (4-dodecyloxyphenol) (9.8 g, 35.2 mmol) in a white solid phase was obtained in a yield of about 37% using dichloromethane in column chromatography.

The synthesized 4-docecyloxyphenol (9.8 g, 35.2 mmol), methacrylic acid (6.0 g, 69.7 mmol), DCC (dicyclohexylcarbodiimide) (10.8 g, 52.3 mmol) and DMAP (p-dimethylaminopyridine) (1.7 g, 13.9 mmol) were placed in the flask and 120 mL of methylene chloride was added thereto, and then reacted at room temperature for 24 hours under nitrogen. After completion of the reaction, the salt (urea salt) generated during the reaction was filtered off and the remaining methylene chloride was also removed. Impurities were removed using hexane and DCM (dichloromethane) as the mobile phase in column chromatography and the product obtained again was recrystallized in a mixed solvent of methanol and water (1:1 mix) to obtain the target product (7.7 g, 22.2 mmol) in a white solid phase in a yield of 63%.

[Formula A]

In Formula A, R is a linear alkyl group having 12 carbon atoms.

<NMR analysis results of monomer (A)>

1H-NMR (CDC13): d7.02 (dd, 2H); d6.89 (dd, 2H); d6.32 (dt, 1H); d5.73 (dt, 1H); d3.94 (t, 2H); d 2.05(dd, 3H); d1.76 (p, 2H); d1.43 (p, 2H); 1.34-1.27 (m, 16H); d0.88 (t, 3H).

PREPARATION EXAMPLE 2

Synthesis of Random Copolymer (B)

0.5340 g of the compound (DPM-C12) of Preparation Example 1, 1.1367 g of pentafluorostyrene, 30.0 mg of an RAFT (reversible addition-fragmentation chain transfer) agent (2-hydroxyethyl 2-((dodecylthio)carbonothioyl)thio)-2-methylpropanoate), 5.1 mg of AIBN (azobisisobutyronitrile) and 1.67 mL of anisole were placed in a 10 mL flask (Schlenk flask), stirred at room temperature for 30 minutes under a nitrogen atmosphere, and then an RAFT (reversible addition-fragmentation chain transfer) was performed at 70° C. for 12 hours. After the polymerization, the reaction solution was precipitated in 250 mL of methanol as an extraction solvent, and then dried after filtering under reduced pressure to prepare a random copolymer. The number average molecular weight (Mn) and the molecular weight distribution (Mw/Mn) of the random copolymer were 12,300 and 1.17, respectively.

PREPARATION EXAMPLE 3

Synthesis of block copolymer (A-1)

2.0 g of the monomer (A) of Preparation Example 1, 64 mg of cyanoisoproyl dithiobenzoate as an RAFT (reversible addition-fragmentation chain transfer) reagent, 23 mg of AIBN (azobisisobutyronitrile) as a radical initiator and 5.34 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The yield of the macro initiator was about 82.6 wt % and the number average molecular weight (Mn) and molecular weight distribution (Mw/Mn) were 9,000 and 1.16, respectively. 0.3 g of the macro initiator, 2.7174 g of a pentafluorostyrene monomer and 1.306 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 115° C. for 4 hours. After the polymerization, the reaction solution was precipitated in 250 mL of methanol as an extraction solvent, and then filtered under reduced pressure and dried to prepare a pale pink block copolymer. The block copolymer comprises a polymer segment A, which is derived from the monomer (A) of Preparation Example 1 and has 12 chain-forming atoms (the number of carbon atoms of R in Formula A), and a polymer segment B derived from the pentafluorostyrene monomer.

PREPARATION EXAMPLE 4

Synthesis of Block Copolymer (A-2)

4.0 g of the monomer (A) of Preparation Example 1, 10.9 mg of cyanoisoproyl dithiobenzoate as an RAFT (reversible addition-fragmentation chain transfer) reagent, 4 mg of AIBN (azobisisobutyronitrile) as a radical initiator and 9.3 g of anisole were placed in a 20 mL Schlenk flask and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The yield of the macro initiator was about 75 wt % and the number average molecular weight (Mn) and molecular weight distribution (Mw/Mn) were 33,100 and 1.25, respectively. 0.5 g of the macro initiator, 3.225 g of a pentafluorostyrene monomer, 1.2 mg of AIBN and 1.248 mL of anisole were placed in a 10 mL Schlenk flask and stirred at room temperature for 1 hour under a nitrogen atmosphere, and then an RAFT (reversible addition-fragmentation chain transfer) polymerization reaction was performed at 70° C. for 6 hours. After the polymerization, the reaction solution was precipitated in 250 mL of methanol as an extraction solvent, and then filtered under reduced pressure and dried to prepare a pale pink block copolymer. The block copolymer comprises a polymer segment A, which is derived from the monomer (A) of Preparation Example 1 and has 12 chain-forming atoms (the number of carbon atoms of R in Formula A), and a polymer segment B derived from the pentafluorostyrene monomer.

PREPARATION EXAMPLE 5

Synthesis of Block Copolymer (A-3)

2.0 g of the monomer (A) of Preparation Example 1, 85 mg of cyanoisoproyl dithiobenzoate as an RAFT (reversible addition-fragmentation chain transfer) reagent, 31 mg of AIBN (azobisisobutyronitrile) as a radical initiator and 4.5 g of anisole were placed in a 20 mL Schlenk flask and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The yield of the macro initiator was about 63 wt % and the number average molecular weight (Mn) and molecular weight distribution (Mw/Mn) were 7,100 and 1.16, respectively. 0.3 g of the macro initiator, 1.312 g of a pentafluorostyrene monomer, 3.5 mg of AIBN and 0.540 mL of anisole were placed in a 10 mL Schlenk flask and stirred at room temperature for 1 hour under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pale pink block copolymer. The block copolymer comprises a polymer segment A, which is derived from the monomer (A) of Preparation Example 1 and has 12 chain-forming atoms (the number of carbon atoms of R in Formula A), and a polymer segment B derived from the pentafluorostyrene monomer.

EXAMPLE 1

Figure 1:
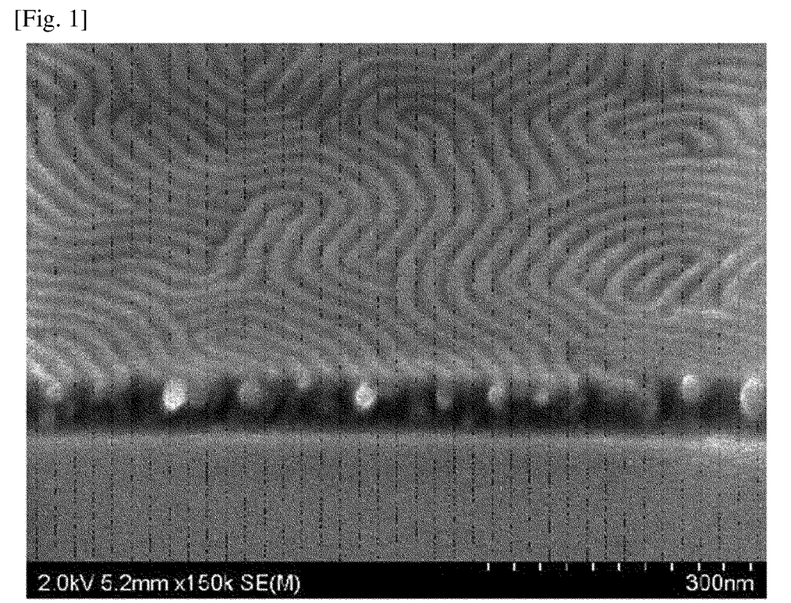
FIG. 1 is an SEM image of the self-assembled structure of the block copolymer of Example 1.

The random copolymer (B) of Preparation Example 2 was coated on a silicon wafer substrate to a thickness of about 40 nm and subjected to thermal annealing at 160° C. for 24 hours to form a polymer membrane. The substrate on which the polymer membrane was formed was subjected to sonication in fluorobenzene for about 10 minutes or so to remove unreacted materials. Subsequently, a block copolymer membrane was formed on the substrate, on which the random copolymer membrane was formed, using the block copolymer (A-1) of Preparation Example 3. Specifically, a coating solution prepared by diluting the block copolymer (A-1) to a solid content concentration of about 1.5 wt % in fluorobenzene was spin-coated on the substrate to a thickness of about 60 nm, dried at room temperature for about 1 hour and then thermally annealed at a temperature of about 160° C. for about 1 hour to form a self-assembled block copolymer membrane. FIG. 1 is an SEM (scanning electron microscope) image of the formed membrane. As could be seen in FIG. 1, the block copolymer formed vertically oriented lamellar patterns highly self-aligned on the polymer membrane, and the pitch was about 31 nm or so. The self-assembled block copolymer membrane was subjected to plasma etching.

Figure 2:
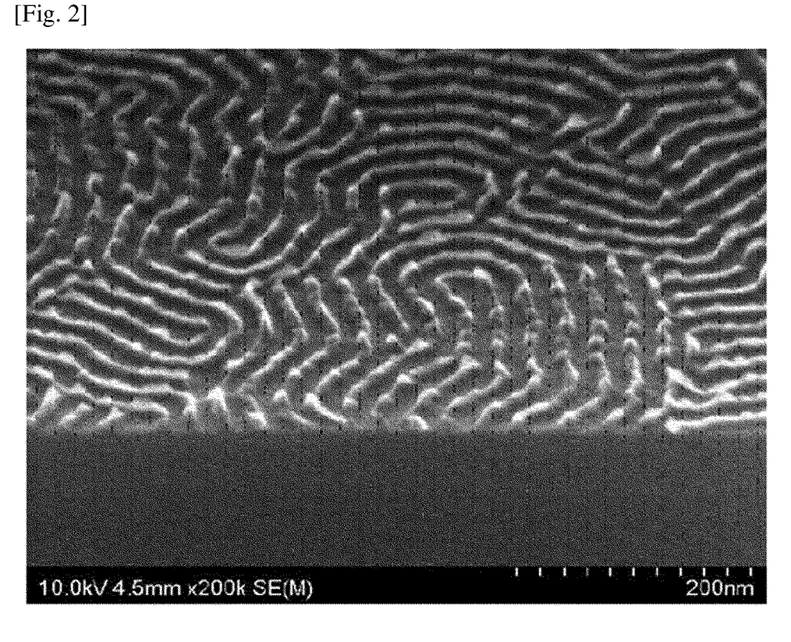
FIG. 2 is an SEM image of the block copolymer of Example 1 after etching.

Specifically, the substrate on which the polymer membrane and the block copolymer membrane were sequentially formed was introduced into an etching chamber. In the etching chamber, two parallel plate electrodes were present facing each other, where the substrate on which the block copolymer membrane was formed was positioned on the electrode to which RF power to be described below was applied between the two electrodes. Subsequently, in a state where the process pressure in the etching chamber was maintained at about 15 mTorr, the RF power of 300 W was applied to the electrode that the block copolymer membrane was positioned thereon to perform etching. The etching was performed while feeding perfluorobutane ($C_4F_8$), argon (Ar) and oxygen ($O_2$), as process gases, at flow rates of 15 sccm, 100 sccm and 25 sccm, respectively, into the chamber, where the etching time was 40 seconds or so. FIG. 2 shows the results of the etching performed as above. As confirmed from FIG. 2, in the case of the etching conditions of the example, the domain formed by one segment of the block copolymer was selectively removed.

EXAMPLE 2

Figure 3:
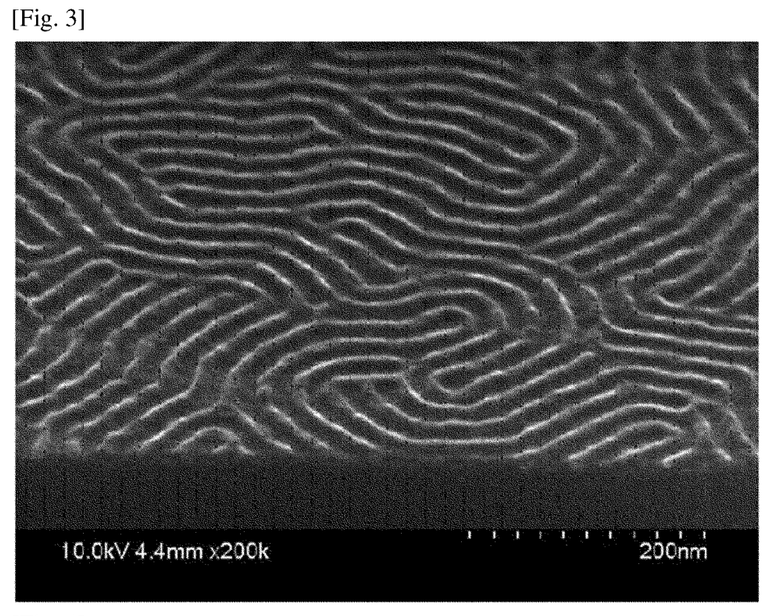
FIG. 3 is an SEM image of the block copolymer of Example 2 after etching.

The etching was performed under the same conditions as those of Example 1, except that fluoroform ($CHF_3$) and oxygen ($O_2$) as process gases were supplied at flow rates of 40 sccm and 10 sccm, respectively, into the etching chamber and the etching time was adjusted to 45 seconds or so. FIG. 3 is an SEM image showing the etching result of Example 2. Through FIG. 3, it can be confirmed that the domain formed by one segment of the block copolymer can be selectively removed by performing the etching under the above conditions.

EXAMPLE 3

Figure 4:
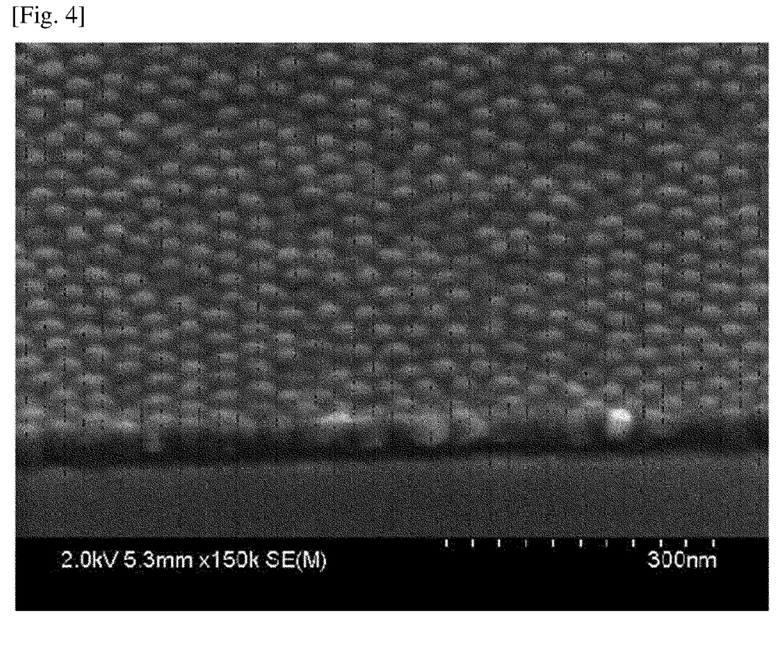
FIG. 4 is an SEM image of the self-assembled structure of the block copolymer of Example 3.
Figure 5:
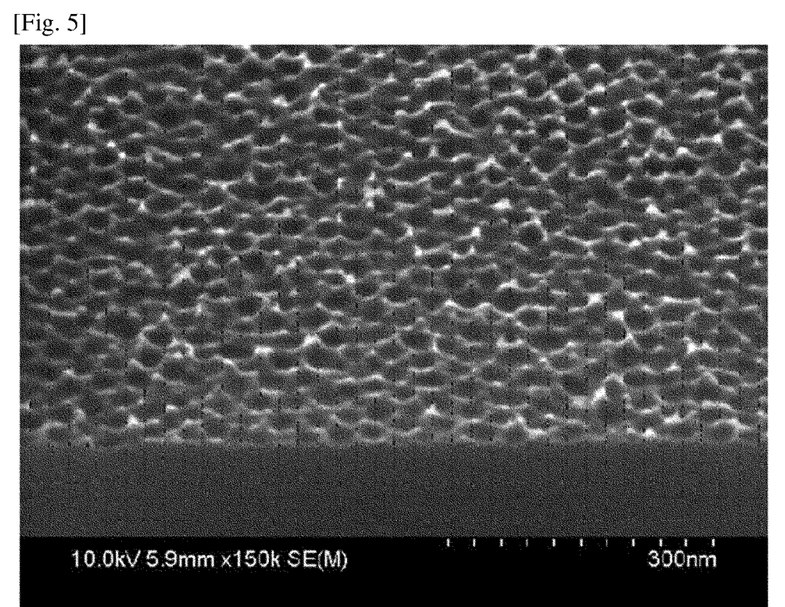
FIG. 5 is an SEM image of the block copolymer of Example 3 after etching.

A coating solution prepared by mixing the block copolymer (A-2) of Preparation Example 4 and the block copolymer (A-3) of Preparation Example 5 at a ratio of 70/30 (parts by weight/weight), respectively and then diluting the mixture to a solid content concentration of about 1.2 wt % in fluorobenzene was spin-coated on a silicon wafer substrate to a thickness of about 50 nm, dried at room temperature for about 1 hour and then again thermally annealed at a temperature of about 180° C. for about 1 hour to form a self-assembled block copolymer membrane. SEM (scanning electron microscope) imaging was performed on the formed block copolymer membrane. FIG. 4 is an SEM (scanning electron microscope) image of the formed block copolymer membrane. As in the drawing, the block copolymer formed vertically oriented lamellar patterns highly aligned in the block copolymer membrane, and the pitch was about 37 nm or so. Plasma etching was performed on the polymer membrane comprising the assembled block copolymer. The etching was performed in the same manner as in Example 1 in the same etching chamber as that of Example 1, where the process pressure was about 15 mTorr or so and the etching was performed by applying RF power of 200 W or so. Perfluorobutane ($C_4F_8$), an argon (Ar) gas and oxygen ($O_2$) as process gases were fed into the chamber at flow rates of 15 sccm, 100 sccm and 25 sccm, respectively, and the etching time was about 35 seconds or so. FIG. 5 shows the results of the etching performed as above. As confirmed from FIG. 5, in the case of the etching conditions of the example, the domain formed by one segment of the block copolymer was selectively removed.

EXAMPLE 4

Plasma etching for pattern transferring the pattern of the block copolymer onto the substrate was performed by further etching the substrate using the membrane of the etched block copolymer of Example 2 as a mask. The pressure in the etching chamber was maintained at 50 mTorr, the RF power was maintained at 80 W, the flow rate of $SF_6$ supplied to the chamber was maintained at 45 sccm, and the etching time was maintained at 15 seconds.

Figure 6:
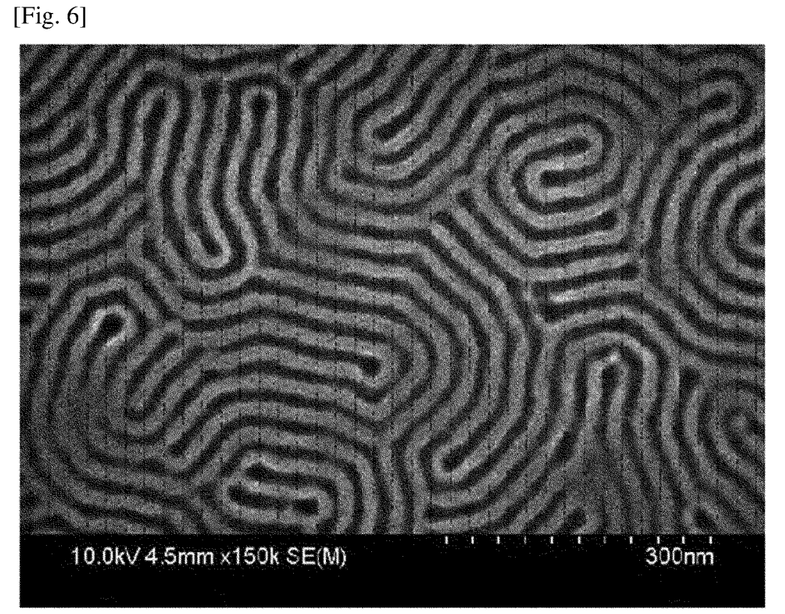
FIG. 6 is an SEM image of the result of performing a pattern transfer on the etched block copolymer membrane of Example 2.

This pattern transfer result was shown in FIG. 6. As confirmed from FIG. 6, when the pattern is transferred onto the substrate using the etched block copolymer membrane of Example 2 as a mask, it can be confirmed that the pattern on the silicon substrate is well formed according to the pattern formed by the block copolymer.

COMPARATIVE EXAMPLE 1

Etching of the block copolymer membrane was performed in the same manner as in Example 1, except that fluoroform ($CHF_3$) and oxygen ($O_2$) as process gases were supplied at flow rates of 40 sccm and 2 sccm, respectively, into the etching chamber, the applied RF power was 200 W, and the etching time was adjusted to 45 seconds or so.

Figure 7:
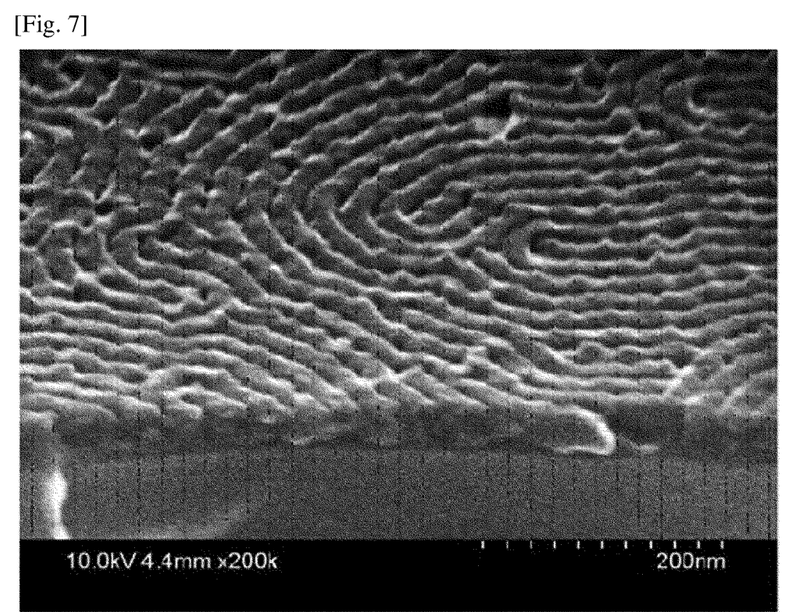
FIG. 7 is an SEM image of the block copolymer of Comparative Example 1 after etching.

FIG. 7 is an SEM image showing the etching result of Comparative Example 1. Through FIG. 7, it can be confirmed that as a result of performing the etching under the above conditions, the domain formed by one segment of the block copolymer cannot be selectively removed.

COMPARATIVE EXAMPLE 2

Etching of the block copolymer membrane was performed in the same manner as in Example 1, except that fluoroform ($CHF_3$) and oxygen ($O_2$) as process gases were supplied at flow rates of 40 sccm and 5 sccm, respectively, into the etching chamber, the applied RF power was 100 W, and the etching time was adjusted to 45 seconds or so.

Figure 8:
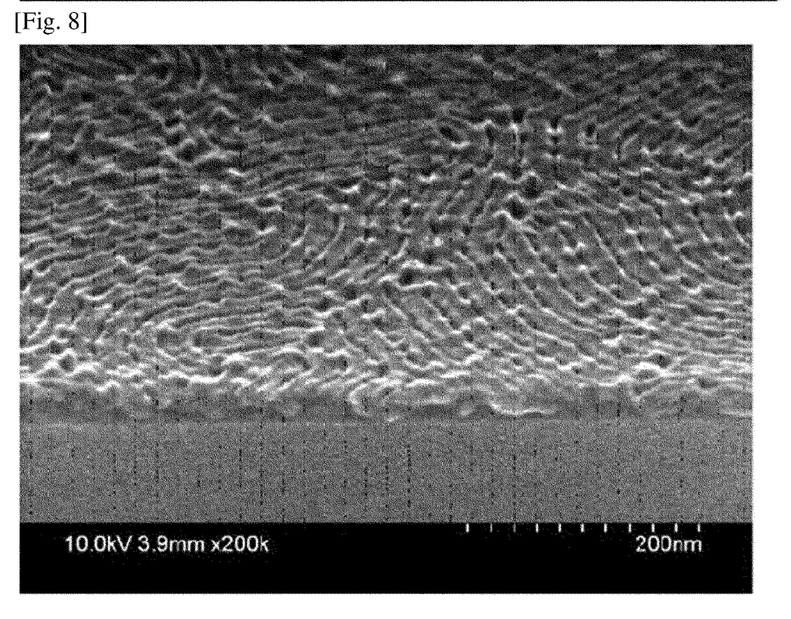
FIG. 8 is an SEM image of the block copolymer of Comparative Example 2 after etching.

FIG. 8 is an SEM image showing the etching result of Comparative Example 2. Through FIG. 8, it can be confirmed that as a result of performing the etching under the above conditions, the domain formed by one segment of the block copolymer cannot be selectively removed.

COMPARATIVE EXAMPLE 3

Etching of the block copolymer membrane was performed in the same manner as in Example 3, except that argon (Ar) and oxygen ($O_2$) as process gases were supplied at flow rates of 25 sccm and 10 sccm, respectively, into the etching chamber, the applied RF power was 50 W, and the etching time was adjusted to 30 seconds or so.

Figure 9:
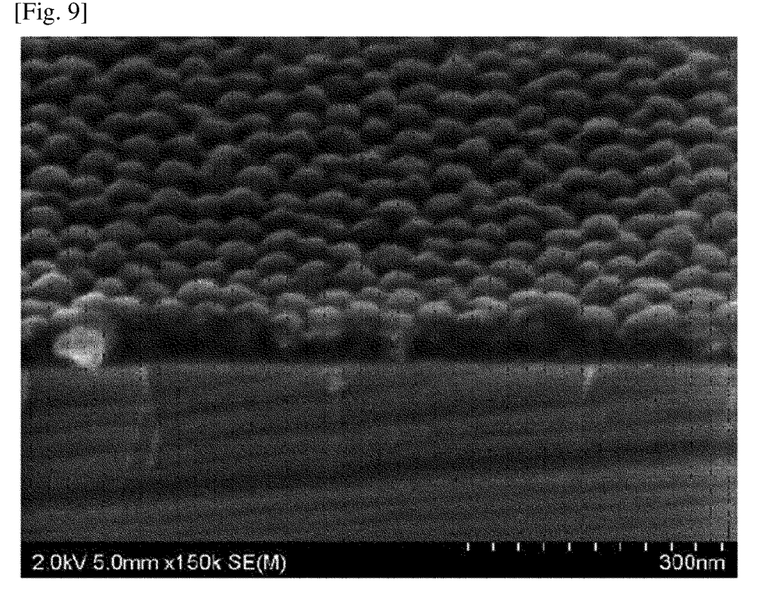
FIG. 9 is an SEM image of the block copolymer of Comparative Example 3 after etching.

FIG. 9 is an SEM image showing the etching result of Comparative Example 3. Through FIG. 9, it can be confirmed that as a result of performing the etching under the above conditions, the segment of the block copolymer forming the matrix is not completely removed.

COMPARATIVE EXAMPLE 4

Etching of the block copolymer membrane was performed in the same manner as in Example 1, except that fluoroform ($CHF_3$) and oxygen ($O_2$) as process gases were supplied at flow rates of 5 sccm and 15 sccm, respectively, into the etching chamber, the applied RF power was 100 W, and the etching time was adjusted to 45 seconds or so.

Figure 10:
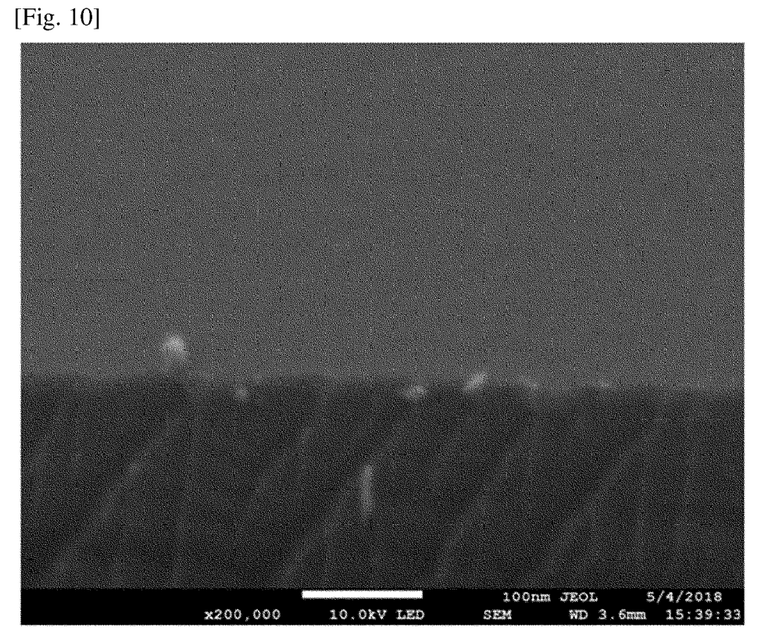
FIG. 10 is an SEM image of the block copolymer of Comparative Example 4 after etching.

FIG. 10 is an SEM image showing the etching result of Comparative Example 4. Through FIG. 10, it can be confirmed that as a result of performing the etching under the above conditions, the domain formed by one segment of the block copolymer cannot be selectively removed.

COMPARATIVE EXAMPLE 5

Etching of the block copolymer membrane was performed in the same manner as in Example 1, except that fluoroform ($CHF_3$) and oxygen ($O_2$) as process gases were supplied at flow rates of 38 sccm and 5 sccm, respectively, into the etching chamber, the applied RF power was 100 W, and the etching time was adjusted to 45 seconds or so.

Figure 11:
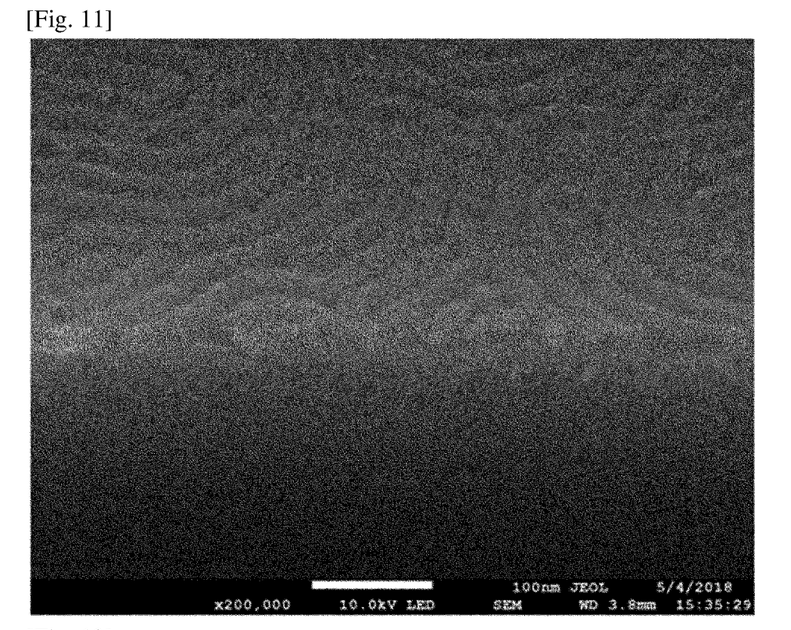
FIG. 11 is an SEM image of the block copolymer of Comparative Example 5 after etching.

FIG. 11 is an SEM image showing the etching result of Comparative Example 5. Through FIG. 11, it can be confirmed that as a result of performing the etching under the above conditions, the domain formed by one segment of the block copolymer cannot be selectively removed.

EXPLANATION OF REFERENCE NUMERALS

10: anode 20: cathode 30: substrate on which a block copolymer membrane is formed
40: RF power source
50: reaction gas 50': reaction gas in a plasma state
51: electron 51': ion sheath or ion shell
52: ion of reaction gas
53: radical of reaction gas
100: reaction chamber

The invention claimed is:

1. A method for preparing a patterned substrate comprising:
   selectively etching any one segment block of a self-assembled block copolymer from a laminate having a substrate;
   wherein a block copolymer membrane is formed on the substrate and the substrate contains the self-assembled block copolymer,
   wherein the selectively etching is performed using a reaction gas containing fluorocarbon and oxygen, and
   the selectively etching is performed while maintaining a ratio (A/B) of a flow rate (A) of the fluorocarbon to a flow rate (B) of the oxygen in a range of 0.5 to 7.5,
   wherein the self-assembled block copolymer comprises a polymer segment A block including a chain having 8 or more chain-forming atoms and a polymer segment B block having a structure different from that of the polymer segment A block,
   wherein the polymer segment A block comprises a ring structure and the chain is substituted on the ring structure, and
   wherein the ring structure of the polymer segment A block comprises no halogen atom and the polymer segment B block has a ring structure including a halogen atom.

2. The method according to claim 1, wherein the selectively etching maintains a flow rate of fluorocarbon of more than 0 sccm and 50 sccm or less.

3. The method according to claim 1, wherein the selectively etching maintains a flow rate of oxygen of more than 0 sccm and 35 sccm or less.

4. The method according to claim 1, wherein the selectively etching further supplies an inert gas at a flow rate of 200 sccm or less.

5. The method according to claim 4, wherein the etching maintains the ratio (A/C) of the flow rate (A) of the fluorocarbon to the flow rate (C) of the inert gas in a range of 0.1 to 1.

6. The method according to claim 1, wherein the fluorocarbon has two or more fluorine atoms and a molar ratio (F/C) of the fluorine atom (F) to the carbon atom (C) is 2 or more.

7. The method according to claim 1, wherein the reaction gas in the selectively etching consists of fluorocarbon and oxygen, or consists of fluorocarbon, oxygen and an inert gas.

8. The method according to claim 1, wherein a range of the applied electric power in the etching step is maintained in the range of 150W to 400W.

9. The method according to claim 1, wherein the selectively etching is performed in a chamber in which two opposite cathode and anode are present, the substrate on which the block copolymer membrane is formed is positioned on the cathode between the cathode and the anode, and an RF power source is applied to the cathode.

10. The method according to claim 1, wherein the block copolymer comprises a polymer segment A block and a polymer segment B block having a structure different from that of the polymer segment A block, and the polymer segment A block and the polymer segment B block each comprise a ring structure.

11. The method according to claim 10, wherein the ring structure of the polymer segment A block comprises no halogen atom, and the ring structure of the polymer segment B block comprises a halogen atom.

12. The method according to claim 10, wherein a chain having 8 or more chain-forming atoms is substituted on the ring structure of the polymer segment A block.

13. The method according to claim 1, further comprising etching the substrate using the block copolymer membrane, from which the any one segment block has been removed, as a mask.

* * * * *